(12) United States Patent
Sakima

(10) Patent No.: US 7,065,164 B1
(45) Date of Patent: Jun. 20, 2006

(54) AUTOMATIC GAIN CONTROL AND WIRELESS COMMUNICATION DEVICE

(75) Inventor: Nobuhiro Sakima, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 730 days.

(21) Appl. No.: 10/070,429

(22) PCT Filed: Jul. 17, 2000

(86) PCT No.: PCT/JP00/04796

§ 371 (c)(1),
(2), (4) Date: Mar. 18, 2002

(87) PCT Pub. No.: WO02/07402

PCT Pub. Date: Jan. 24, 2002

(51) Int. Cl.
*H04L 27/06* (2006.01)

(52) U.S. Cl. .............. 375/345; 455/138; 455/240.1; 455/245.1

(58) Field of Classification Search ......... 455/136, 455/138, 250.1, 245.1, 247.1, 234.1, 277.1, 455/276.1, 27; 375/345, 347; 370/395.64, 370/47, 506, 509, 512, 175
See application file for complete search history.

(56) References Cited

U.S. PATENT DOCUMENTS

| | | | | |
|---|---|---|---|---|
| 5,524,009 A * | 6/1996 | Tuutijarvi et al. | ......... | 370/332 |
| 5,638,375 A * | 6/1997 | Dettro et al. | ............... | 370/324 |
| 5,805,643 A * | 9/1998 | Seki et al. | .................. | 375/347 |
| 5,812,025 A * | 9/1998 | Shimazaki | ................. | 330/129 |
| 5,917,865 A * | 6/1999 | Kopmeiners et al. | ....... | 375/345 |
| 6,163,342 A * | 12/2000 | Suzuki | ....................... | 348/364 |
| 6,240,100 B1 * | 5/2001 | Riordan et al. | ............. | 370/442 |
| 6,771,613 B1 * | 8/2004 | O'Toole et al. | ............. | 370/277 |
| 6,782,061 B1 * | 8/2004 | Ichihara | ..................... | 375/345 |
| 6,853,837 B1 * | 2/2005 | Oda | ......................... | 455/234.1 |
| 2001/0046727 A1 * | 11/2001 | Lin et al. | .................... | 438/142 |
| 2001/0048727 A1 * | 12/2001 | Schmutz et al. | ........... | 375/345 |
| 2003/0027610 A1 * | 2/2003 | Loke | .......................... | 455/575 |

FOREIGN PATENT DOCUMENTS

| | | |
|---|---|---|
| EP | 0 929 150 A1 | 7/1999 |
| JP | 6-152478 | 5/1994 |
| JP | 7-94981 | 4/1995 |
| JP | 9-307380 | 11/1997 |
| JP | 10-506764 | 6/1998 |
| JP | 11-177546 | 7/1999 |
| WO | 98/10514 | 3/1998 |

* cited by examiner

*Primary Examiner*—Tesfaldet Bocure
*Assistant Examiner*—Nasrin Hoque
(74) *Attorney, Agent, or Firm*—Oblon, Spivak, McClelland, Maier & Neustadt, P.C.

(57) ABSTRACT

A wireless communication apparatus includes an antenna receiving a radio signal, a variable gain amplifier amplifying the received signal using a variable gain, an analog-to-digital converter converting the amplified signal into a digital signal, a gain setting unit periodically updating the gain of the variable gain amplifier in accordance with an output from the analog-to-digital converter, and an operating mode selection unit selecting one of a plurality of operating modes characterized by different gain updating periods in accordance with the output from the analog-to-digital converter, the selected operating mode being set in the gain setting unit. With this construction, the precision in conversion by the analog-to-digital converter is maintained at a proper level when an environment for signal reception varies.

18 Claims, 9 Drawing Sheets

AUTOMATIC GAIN CONTROL AND WIRELESS COMMUNICATION DEVICE

TECHNICAL FIELD

The present invention relates to an automatic gain controller controlling a gain of a variable gain amplifier provided at an input of an analog-to-digital converter, and also to a wireless communication apparatus using the same.

BACKGROUND ART

FIG. 9 shows a wireless communication apparatus to which an automatic gain controller (AGC) according to the related art is applied. In the wireless communication apparatus, a signal received by an antenna 2 is amplified by an amplified 3 and a variable gain amplifier 4. An I-component and a Q-component of the amplified signal are isolated by a mixer 5. The isolated signals are then subject to analog-to-digital conversion by analog-to-digital converters 6i and 6q, respectively and are decoded by a processing unit 7. An automatic gain controller 8 calculates a difference between an output value of the analog-to-digital converter 6i and a reference value and also calculates a difference between an output value of the analog-to-digital converter 6q and the reference value so as to produce an error signal. The automatic gain controller 8 compares the error signal with a threshold value and so as to update the gain of the variable gain amplifier 4 at predetermined intervals in accordance with a result of comparison. With this construction, signals at a level adapted to the dynamic range of the analog-to-digital converters 6i and 6q are input to the analog-to-digital converters 6i and 6q so that the precision in conversion by the analog-to-digital converters 6i and 6q is maintained at a proper level.

For example, published Japanese translation of PCT international publication for patent application No. 10-506764 discloses automatic gain control in which the gain is controlled as a result of performing comparison between the error signal and the threshold value.

In the related art, however, the gain is updated only after a predetermined period of time elapses even when the environment for reception changes as a result of, for example, a rapid variation in the level of received power. For this reason, a signal not adapted for the dynamic range of the analog-to-digital converter may be input to the analog-to-digital converter when there is a rapid change in the level of received power, resulting in decrease in the precision in conversion by the analog-to-digital converter.

DISCLOSURE OF THE INVENTION

An object of the present invention is to provide an automatic gain controller and a wireless base station in which a precision in conversion by an analog-to-digital converter is maintained at a proper level even when an environment for reception is changed.

The present invention provides an automatic gain controller for controlling a gain of a variable gain amplifier provided at an input of an analog-to-digital converter, comprising:

a gain setting unit periodically updating the gain of the variable gain amplifier in accordance with an output from the analog-to-digital converter; and a mode selection unit selecting one of a plurality of operating modes characterized by different gain updating periods in accordance with variation in the output from the analog-to-digital converter, the selected operating mode being set in said gain setting unit.

According to this aspect of the invention, the gain of the variable gain amplifier is controlled in one of a plurality of operating modes characterized by difference gain updating periods in accordance with variation in the level of received power. Therefore, the gain of the variable amplifier is controlled depending on variation in an environment for communication so that the precision in conversion by the analog-to-digital converter is maintained at a proper level.

The present invention also provides a wireless communication apparatus comprising:

an antenna receiving a radio signal;

a variable gain amplifier amplifying the received signal using a variable gain;

an analog-to-digital converter converting the amplified signal into a digital signal;

a gain setting unit periodically updating the gain of the variable gain amplifier in accordance with an output from a analog-to-digital converter; and an operating mode selection unit selecting one of a plurality of operating modes characterized by difference gain updating periods in accordance with variation in the output from said analog-to-digital converter, the selected operating mode being set in said gain setting unit.

According to this aspect of the invention, it is possible to control the gain of the variable gain amplifier in a wireless communication apparatus to which the automatic gain control is applied, depending on variation in an environment for communication. Therefore, the precision in conversion by the analog-to-digital converter in the apparatus is maintained at a proper level.

The present invention provides a wireless communication apparatus comprising:

an antenna receiving a radio signal; an isolator isolating an I-component and a Q-component orthogonal to each other from the received signal;

an I-component variable gain amplifier and a Q-component variable gain amplifier amplifying the isolated I-component and Q-component, respectively using a variable gain;

an I-component analog-to-digital converter and a Q-component analog-to-digital converter converting the amplified I-component and Q-component, respectively, into respective digital signals;

a gain setting unit periodically updating a gain common to said I-component variable gain amplifier and said Q-component variable gain amplifier, in accordance with outputs from said I-component analog-to-digital converter and said Q-component analog-to-digital converter; and an operating mode selection unit selecting one of a plurality of operating modes characterized by different gain updating periods in accordance with variation in the outputs from said I-component analog-to-digital converter and said Q-component analog-to-digital converter, the selected operating mode being set in said gain setting unit.

According to this aspect of the invention, the gain of the I-component variable gain amplifier and the gain of the Q-component variable gain amplifier are centrally controlled in a wireless communication apparatus operated on quadrature modulation. Therefore, the construction of the apparatus is simplified.

The present invention provides a wireless communication apparatus comprising:

an antenna receiving a radio signal;

an isolator isolating an I-component and a Q-component orthogonal to each other from the received signal;

an I-component variable gain amplifier and a Q-component variable gain amplifier amplifying the isolated I-component and Q-component using a variable gain;

an I-component analog-to-digital converter and a Q-component analog-to-digital converter converting the amplified I-component and Q-component into respective digital signals;

an I-component gain setting unit periodically updating a gain of said I-component variable gain amplifier in accordance with an output from said I—-component analog-to-digital converter;

an I-component operating mode selection unit selecting one of a plurality of operating modes characterized by different gain updating periods in accordance with variation in the output from said I-component analog-to-digital converter, the selected operating mode being set in said I-component gain setting unit;

a Q-component gain setting unit periodically updating a gain of said Q-component variable gain amplifier in accordance with an output from said Q-component analog-to-digital converter; and a Q-component operating mode selection unit selecting one of a plurality of operating modes characterized by different gain updating periods in accordance with variation in the output from said Q-component analog-to-digital converter, the selected operating mode being set in said Q-component gain setting unit.

According to this aspect of the invention, the operating mode is selected for the I-component and the Q-component individually so that the gain of the variable gain amplifier 23$i$ and the gain of the variable gain amplifier 23$q$ are controlled independently.

The present invention provides a wireless communication apparatus comprising:

a first antenna and a second antenna receiving a radio signal:

a first variable gain amplifier and a second variable gain amplifier amplifying the signal received via said first antenna and second antenna, respectively;

a first analog-to-digital converter and a second analog-to-digital converter respectively converting the amplified signals into respective digital signals;

a gain setting unit periodically updating a gain common to said first variable gain amplifier and second variable gain amplifier in accordance with an output from said first analog-to-digital converter and an output from said second analog-to-digital converter; and an operating mode selection unit selecting one of a plurality of operating modes characterized by different gain updating periods in accordance with variation in the outputs from said first analog-to-digital converter and said second analog-to-digital converter, the selected operating mode being set in said gain setting unit.

According to this aspect of the invention, signals from the first branch and the second branch are synthesized in a wireless communication apparatus provided with diversity branches so that the gain setting unit centrally controls the gain of the first variable gain amplifier and the gain of the second variable gain amplifier. Therefore, the construction of the apparatus is simplified.

The wireless communication apparatus may further comprise a processing unit calculating a received power from the output value of the analog-to-digital converter using the gain set in the gain setting unit.

According to this aspect of the invention, a digital output corresponding to an analog signal amplified by the variable gain amplifier is corrected to have a digital signal corresponding to an analog signal before amplification so that an accurate received power measurement is made.

BEST MODE FOR CARRYING OUT THE INVENTION

The various embodiments of the invention will be described hereinafter with reference to the attached drawings.

First Embodiment

Figure 1:
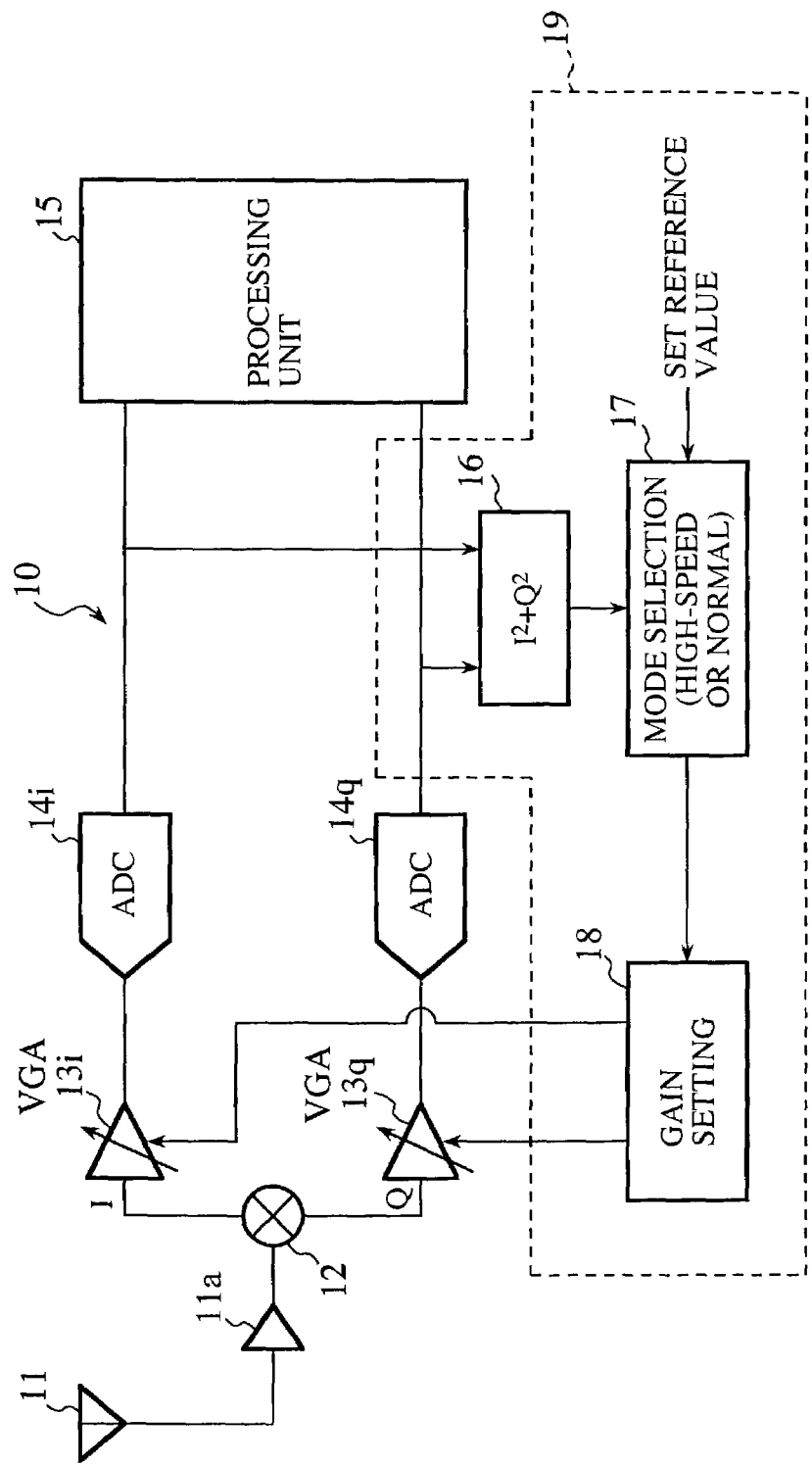
FIG. 1 is a block diagram showing an electrical construction of a wireless communication apparatus according to a first embodiment of the present invention.

FIG. 1 is a block diagram showing an electrical construction of a wireless communication apparatus according to a first embodiment of the present invention. The wireless communication apparatus 10 comprises an antenna 11$a$, a mixer 12, variable gain amplifiers (VGA) 13$i$ and 13$q$, analog-to-digital converters 14$i$ and 14$q$, a processing unit 15, and an automatic gain controller (AGC) 19.

The antenna 11 receives a radio signal from a wireless terminal such as a portable terminal. The wireless terminal is configured to generate a radio signal by mixing an I component and a Q component by quadrature modulation. The mixer 12 detects the signal from the antenna 11 so as to retrieve the I component and the Q component by a process of isolation. The variable gain amplifiers 13$i$ and 13$q$ respectively amplify the I component and the Q component isolated by the mixer 12. The analog-to-digital converters 14$i$ and 14$q$ convert the analog signals received from the variable gain amplifiers 13$i$ and 13$q$, respectively, into digital signals. The processing unit 15 performs various processes including re-synthesis of the component signals and spectrum despreading. The processing unit 15 also calculates the level of received power from output values of the analog-to-digital converters 14$i$ and 14$q$, and from the level of gain control.

The automatic gain controller 19 is provided with an operation unit ($I^2+Q^2$) 16, a mode selection unit 17 and a gain setting unit 18, so as to control a common gain of the variable amplifiers 13$i$ and 13$q$. The operation unit 16 calculates $\Sigma(I^2+Q^2)$, based on the output values of the analog-to-digital converters 14$i$ and 14$q$. The mode selection unit 17 selects a normal mode or a high-speed mode, based on the result of calculation, the normal mode and the high-speed mode being characterized by different periods of update. The gain setting unit 18 updates the common gain of the variable gain amplifiers 13i and 13q in the operating mode selected by the mode selection unit 17.

The processing unit 15 calculates the level of received power from the output values of the analog-to-digital converters 14i and 14q, and the level of gain control set by the gain setting unit 18. The processing unit 15 controls the power to be transmitted from the wireless communication apparatus in accordance with the calculated level. Alternatively, the processing unit 15 informs a remote end with which the wireless communication apparatus is communicating of the level of received power so that the remote end controls the level of transmission accordingly.

With this construction, the I component and the Q component are subject to integrated control using the operation unit 16. The gain of the variable amplifiers 13i and 13q is subject to integrated control by the gain setting unit 18. Accordingly, the construction of the apparatus is simplified. Since the operation unit 16 performs a calculation $\Sigma(I^2+Q^2)$, the I component and the Q component are equally weighted. Therefore, appropriate performance in control is guaranteed under any environment for communication.

A description will now be given of the operation of the wireless communication apparatus with reference to FIGS. 2–6.

Figure 2:
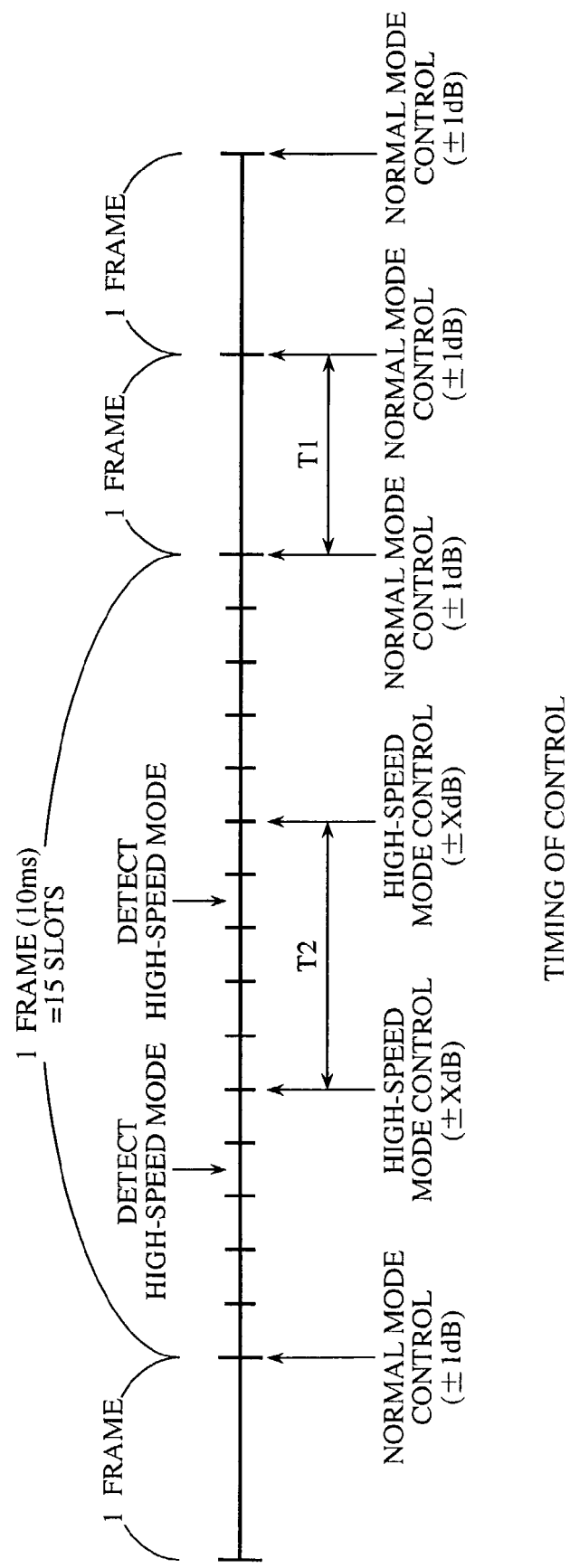
FIG. 2 shows an operating mode of a gain setting unit 18.

FIG. 2 shows an operating mode of the gain setting unit 18. A frame is defined as having a duration of 10 ms and a segment of a frame produced by division-by-15 is defined as one slot. A normal mode is defined as an operating mode with a gain updating period of T1, which is relatively long. A high-speed mode is defined as an operating mode with a gain updating period of T2 (<T1), which is relative short. For example, as shown in FIG. 2, the period T1 may be equal to the duration of one frame, i.e. 10 ms. The period T2 may be equal to the duration of 5 slots, i.e. 10/3 ms. While the normal mode is being set, the gain setting unit updates the gain at the period of T1. When the high-speed mode is set, the gain setting unit updates the gain at the period of T2.

Figure 3:
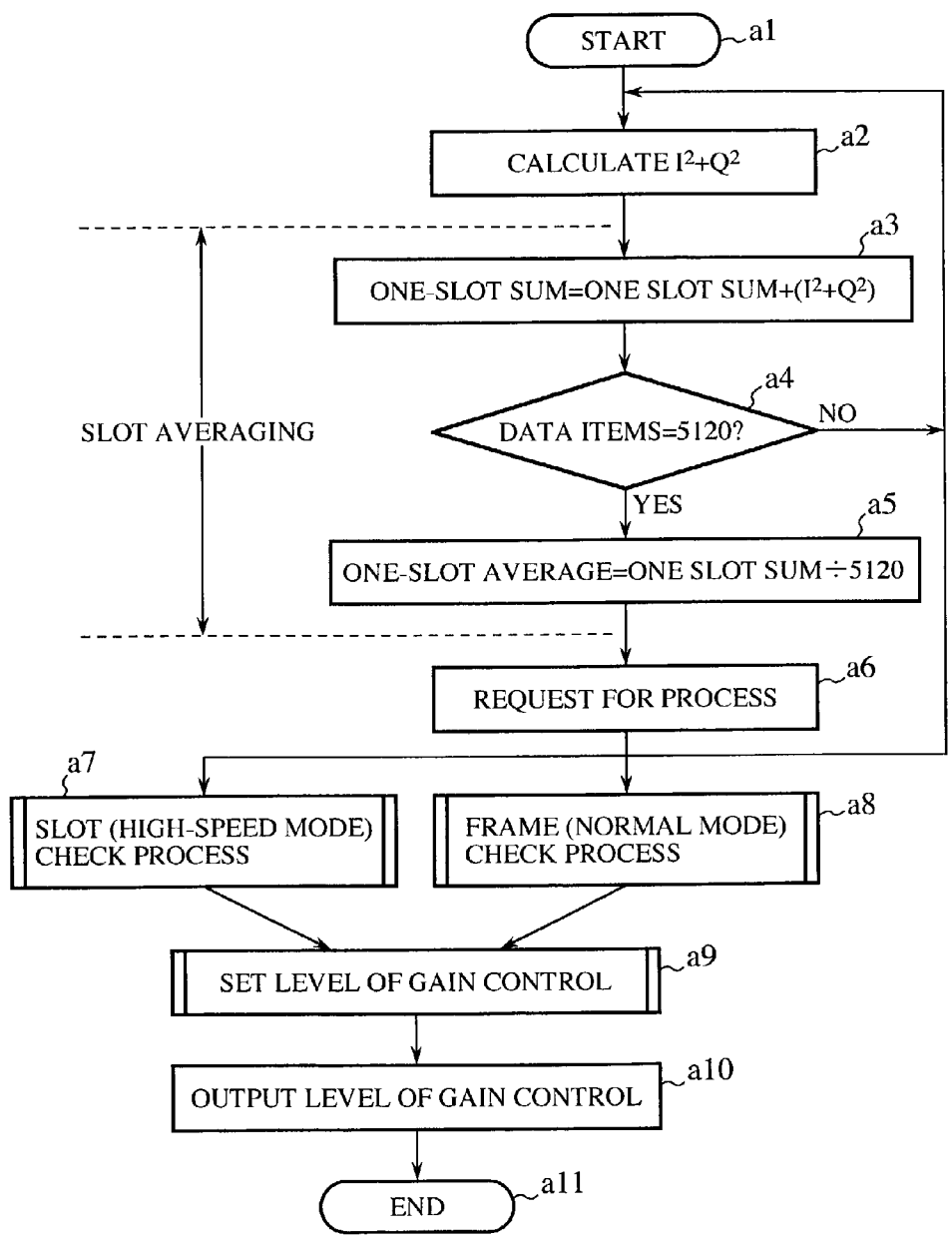
FIG. 3 is a flowchart showing a flow of an automatic gain control process.

FIG. 3 is a flowchart showing a flow of AGC process. In step a1, the process is started. In step a2, $I^2+Q^2$ is calculated by the operation unit 16.

In step a3, $I^2+Q^2$ is added to one-slot sum of signal power. In step a4, a determination is made as to whether the number of data items examined reached the number of data items (for example, 5120) accommodated in one slot. When it is determined that the number of data items does not reach the total number for one slot, steps a2–a4 are repeated until the number of data items reaches the total number. When the number of data items reaches the total number, the one-slot sum of signal power is divided by the number of data items in one slot. Thus, through steps a3–a5, an average value of $(I^2+Q^2)$ in one slot is calculated.

In step a6, a request is issued, the request being related either to a slot check process for determining whether a high-speed mode is necessary, and to a frame check process for determining whether the normal mode is necessary. When step a6 is completed, steps a7 and a8 are performed. Control is then returned to step a2 whereupon the slot-averaging process is repeated. In step a7, the slot check process for the high-speed mode is performed in accordance with the request. In step a8, the frame check process is performed in accordance with the request. Steps a7 and 8 are described later in detail with reference to FIGS. 4 and 5.

In step a9, the level of gain control is set. A detailed description of step a9 will be given later with reference to FIG. 6. In step a10, the level of gain control is output from the gain setting unit 18 to the variable gain amplifiers 13i and 13q. In step a11, the whole process is terminated.

Figure 4:
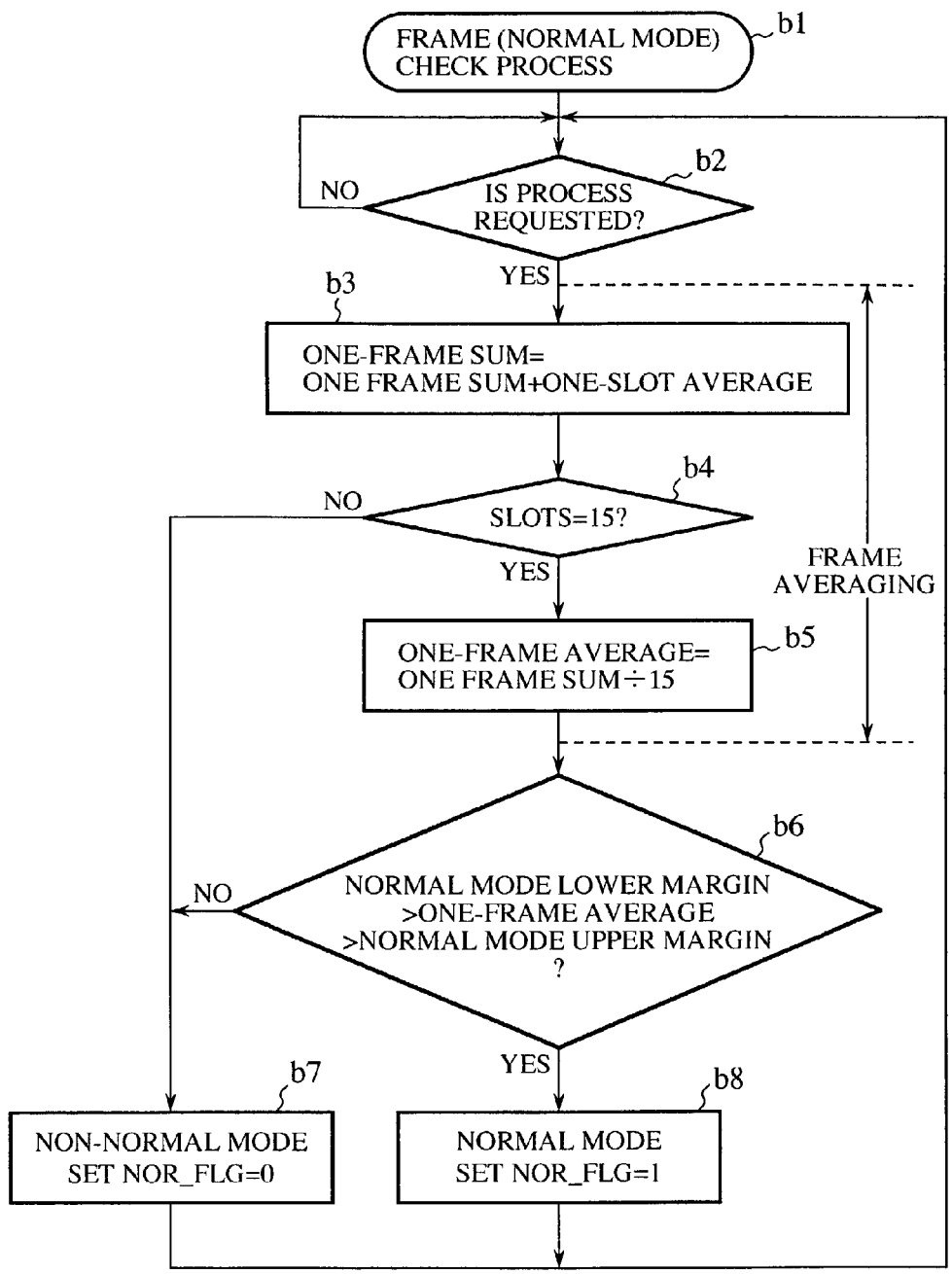
FIG. 4 is a flowchart showing a frame check process of FIG. 3 in detail.

FIG. 4 is a flowchart showing the frame check process of FIG. 3 in detail. In step b1, the frame check process is started. In step b2, a determination is made as to whether there is a request for the frame check process. When it is determined that the request is not provided, the determination step b2 is repeated until a positive determination is yielded. When there is a request for the frame check process, control is turned to step b3 where one-slot average value calculated in the process of FIG. 3 is added to one-frame sum of signal power.

In step b4, a determination is made as to whether the number of slots reaches 15. When the number of slots reaches 15, control is turned to step b5 where the one-frame sum of signal power is divided by 15 so as to obtain a frame average value. Thus, through steps b3–b5, the one-frame average value is calculated.

In step b6, a determination is made as to whether the one-frame average value is lower than a lower margin Ls of a range of average values that calls for the normal mode or higher than the upper margin Us that calls for the normal mode. If a negative answer is yielded in step b4 or in step b6, control is turned to step b7 where "0", indicating a non-normal mode, is substituted in a normal operation flag NOR_FLAG. If an affirmative answer is yielded in step b6, "1", indicating the normal mode, is substituted in the normal operation flag NOR_FLAG.

Thus, in the frame check process of FIG. 4, steps b2–b8 are repeated so that the normal operation flag NOR_FLAG is updated. Particularly, in step b6, variation in the received power is evaluated by examining the one-frame average value. The normal operation flag NOR_FLAG is set to the normal mode or the non-normal mode depending on the result of evaluation.

The upper margin Us and the lower margin Ls of a range of one-frame average value that calls for the normal mode are predetermined. The upper margin Us is selected to be higher than the lower margin Ls.

Figure 5:
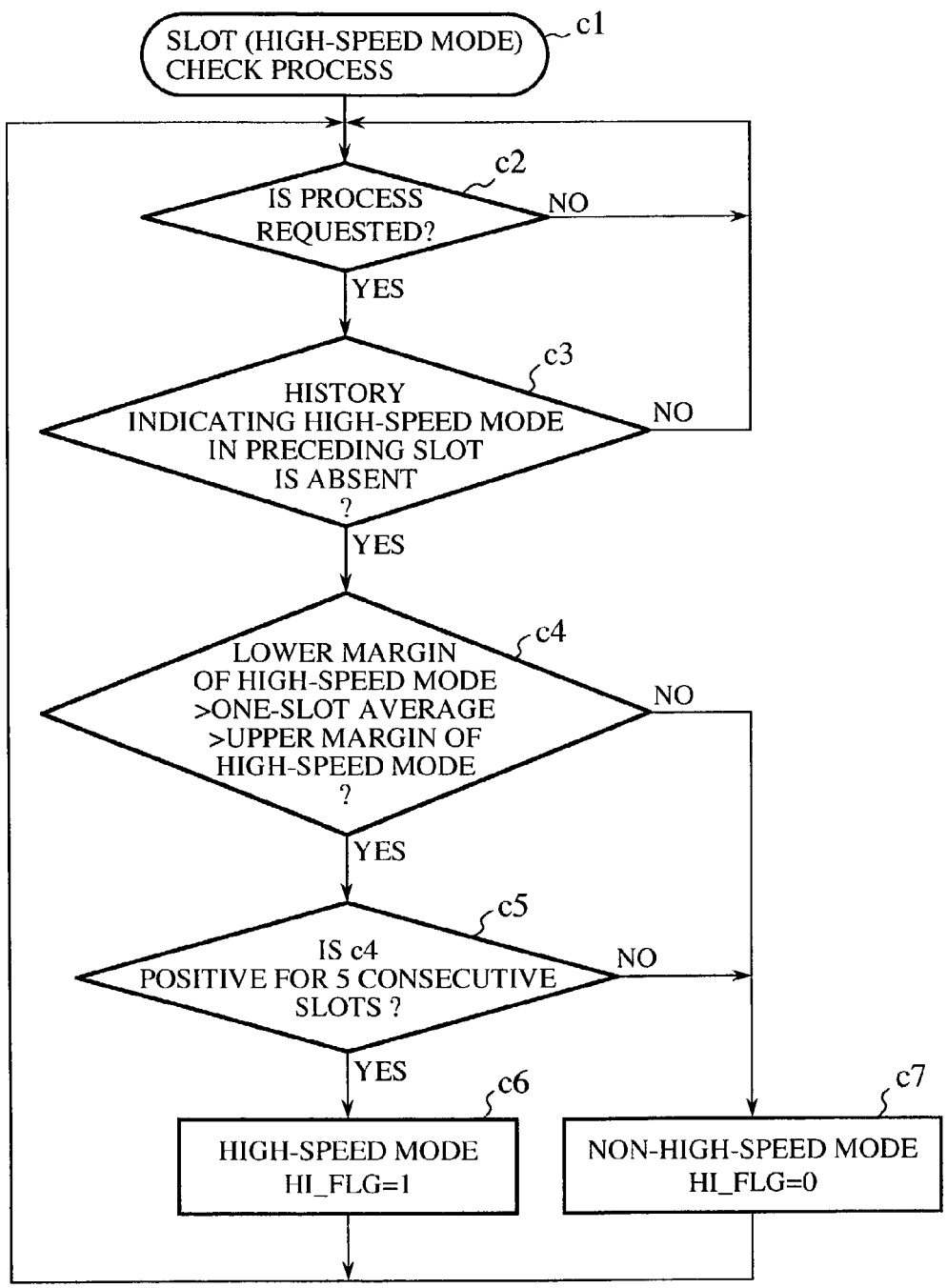
FIG. 5 is a flowchart showing a slot check process of FIG. 3 in detail.

FIG. 5 is a flowchart showing the slot check process of FIG. 3 in detail. In step c1, the slot check process is started. In step c2, a determination is made as to whether there is a request for the slot check process. When it is determined that the request is not provided, the determination step c2 is repeated until a positive determination is yielded. When there is a request for the slot check process, control is turned to step c3 where a determination is made as to whether there is absence of history indicating that high-speed mode was used in the preceding slot. If the high-speed mode was used, i.e. if a negative answer is yielded in step c3, the determination steps c2 and c3 are repeated.

If it is determined that the history indicates that the high-speed mode was not used in the preceding slot, i.e. if a positive answer is yielded in step c3, control is turned to step c4 where a determination is made as to whether the one-slot average value, determined in accordance with FIG. 3, is lower than a lower margin Lh that calls for the high-speed mode or higher than a higher margin Uh that calls for the high-speed mode. If an affirmative answer is yielded in step c4, control is turned to step c5 where a determination is made as to whether an affirmative answer is yielded for a total of n consecutive slots, where n is an integer greater than 1. If an affirmative answer is yielded in step c5, "1", indicating the high-speed mode, is substituted in a high-speed operation flag HI_FLAG in a subsequent step c6. If a negative answer is yielded in step c4 or in step c5, control is turned to step c7 where "0", indicating a non-high-speed mode, is substituted in the high-speed operation flag HI_FLAG in step c7.

Thus, in the slot check process of FIG. 5, steps c2–c7 are repeated so that the high-speed operation flag is updated. Particularly, in steps c4 and c5, variation in the received power is evaluated by examining the one-slot average value. The high-speed operation flag HI_FLAG is set to the high-speed mode or the non-hish-speed mode depending on the result of evaluation.

The upper margin Uh and the lower margin Lh of a range of one-slot average value that calls for the high-speed mode are predetermined. The upper margin Uh is selected to be higher than the upper margin Us and the lower margin Lh is selected to be lower than the lower margin Ls.

Figure 6:
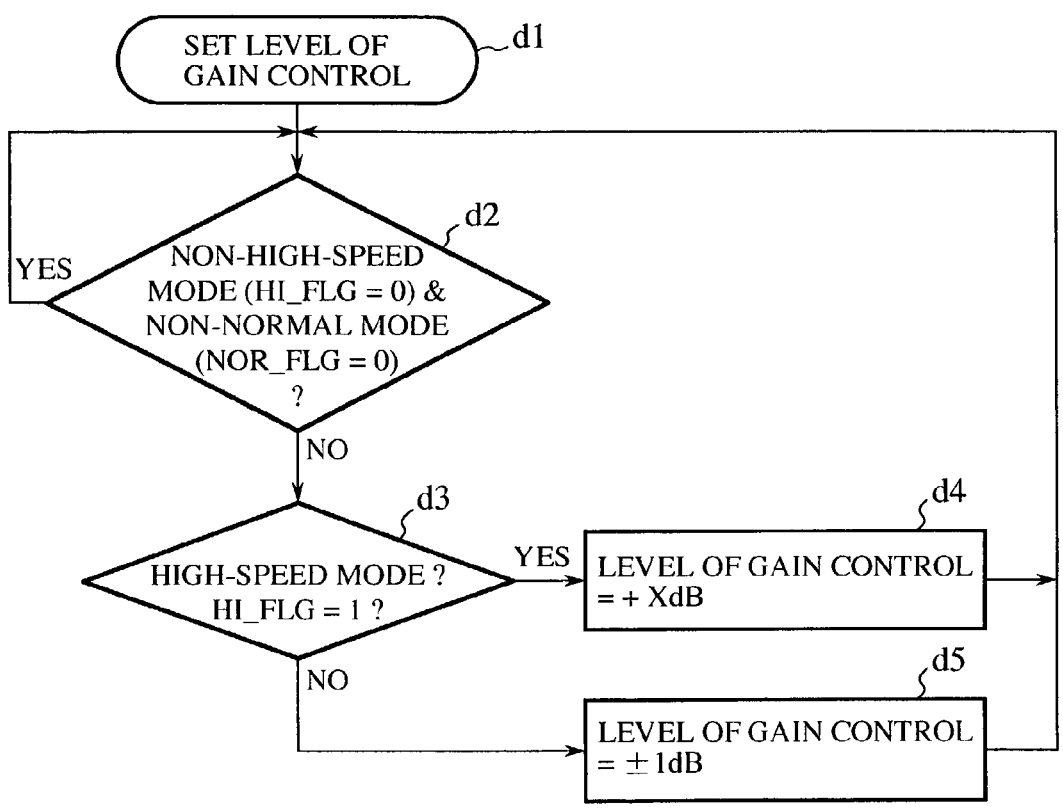
FIG. 6 is a flowchart showing a gain control level setting process of FIG. 3 in detail.

FIG. 6 is a flowchart showing in detail the process of setting the level of gain control shown in FIG. 3. In step d1, the process of setting the level of gain control is started. In step d2, a determination is made as to whether the normal operation flag NOR_FLAG=0 and the high-speed operation flag HI_FLAG=0. That is, a determination is made as to whether both the non-normal mode and the non-high-speed mode are called for. When it is determined that the non-normal mode and the non-high-speed mode are both called for, the determination step d2 is repeated until it is determined that either the normal mode or the high-speed mode is called for.

If a negative answer is yielded in step d2, i.e. if it is determined that the normal mode or the high-speed mode is called for, control is turned to step d3 where a determination is made as to whether the high-speed operation flag HI_FLAG=1, i.e. whether the high-speed mode is called for. If it is determined that the high-speed mode is called for, control is turned to step d4 where the level of gain control is set to ±XdB, where X indicates a real number greater than 1, whereupon control is returned to step d2. If it is determined in step d3 that the high-speed mode is not called for, it is determined that the normal mode is called for. In step d5, the level of gain control is set to ±1 dB so that control is returned to step d2.

According to the process of setting the level of gain control shown in FIG. 6, the level of gain control is updated in accordance with variation in the received power, by repeating steps d2–d5 after setting the level of gain control in step d4 or in step d5. Steps a3 of FIG. 3 through d3 are performed in the mode selection unit 17. Step d4 and the subsequent steps are performed in the gain setting unit 18.

As described, according to the first embodiment, the gain of the variable gain amplifier is updated in one of the two operating modes characterized by different updating periods, in accordance with variation in the received power. Thus, it is possible to control the gain of the variable gain amplifier in accordance with a change in the environment for communication. That is, even when the environment for communication changes, the analog-to-digital converters continue to receive signals adapted for the dynamic range thereof so that the precision in conversion by the analog-to-digital converters is maintained at a proper level.

One particular application is wireless base stations of a code division multiple access (CDMA) system which are normally characterized by only slight variation in the received power. In these base stations, a moderate gain control is favorable. Therefore, the normal mode according to the invention may suitably be employed for control. In rare cases, where there is an abrupt change in the power, the high-speed mode may be employed for control so that the urgent need for keeping track of the variation is properly met. Accordingly, it is possible to effect control adapted for the environment for communication.

In the foregoing description of the first embodiment, it is assumed that quadrature modulation producing the I component and the Q component, 90° phase-displaced from each other, is employed. The present invention may find applications in other type of modulation including a simple modulation. The level of gain control in the normal mode may be other than ±1 dB. Although it is assumed that the calculation $\Sigma(I^2+Q^2)$ is performed, the operation unit 16 may perform other types of calculations. For example, $\Sigma I^2$ and $\Sigma Q^2$ are calculated separately so that the common gain of the variable gain amplifiers 13$i$ and 13$q$ is set based on these results of calculation.

Second Embodiment

Figure 7:
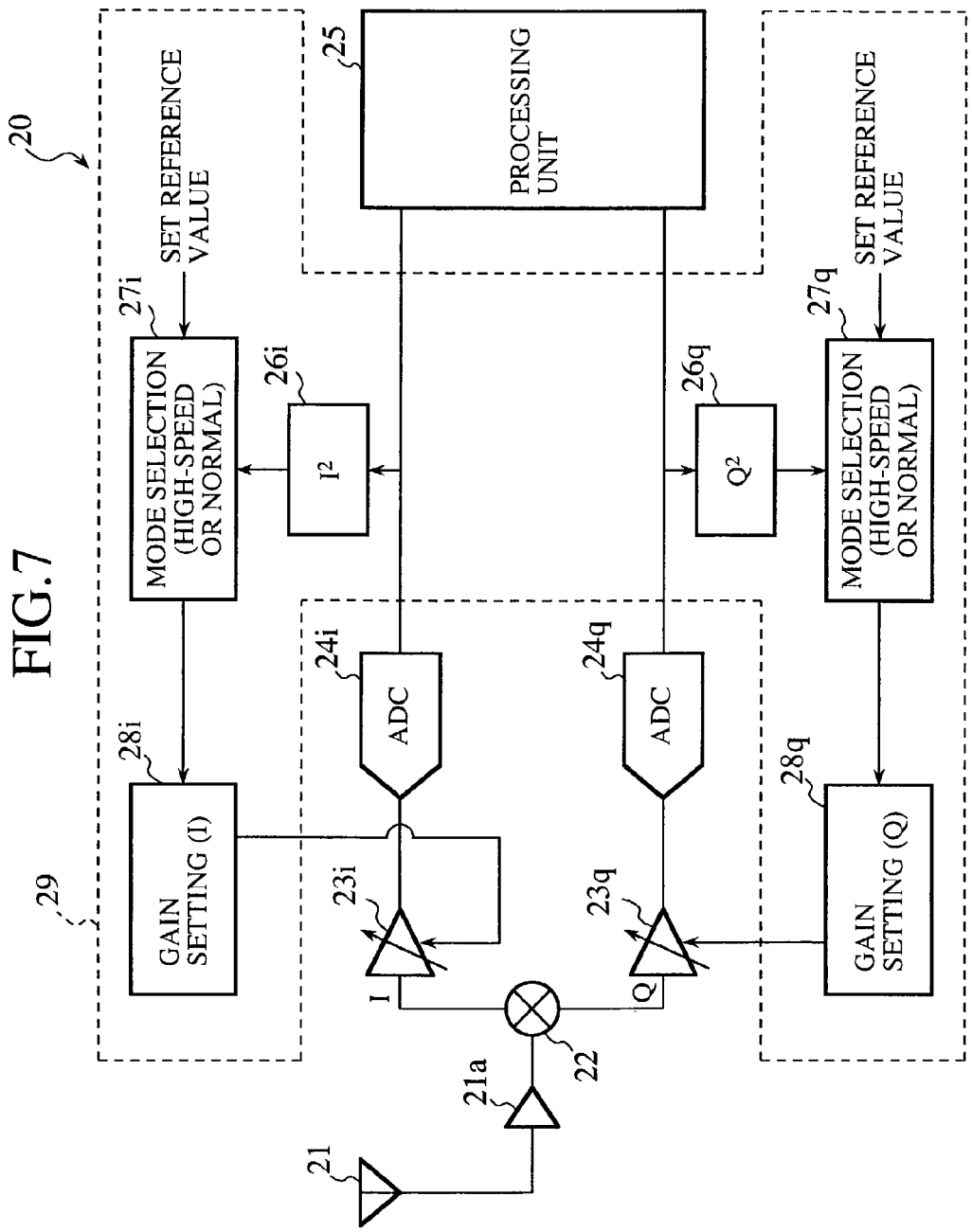
FIG. 7 is a block diagram showing an electrical construction of a wireless communication apparatus according to a second embodiment of the present invention.

FIG. 7 is a block diagram showing an electrical construction of a wireless communication apparatus according to a second embodiment of the present invention. The wireless communication apparatus 20, which is a variation of the wireless communication apparatus of the first embodiment, comprises an antenna 21, an amplifier 21$a$, a mixer 22, variable gain amplifiers (VGA) 23$i$ and 23$q$, analog-to-digital converters 24$i$ and 24$q$, a processing unit 25, and an automatic gain controller (AGC) 29. The antenna 21, the amplifier 21$a$, the mixer 22, the variable gain amplifiers (VGA) 23$i$ and 23$q$, the analog-to-digital converters 24$i$ and 24$q$, and the processing unit 25 are the same as the corresponding components of FIG. 1 so that the description thereof is omitted.

The automatic gain controller 29 is provided with an operation unit ($I^2$) 26$i$, an operation unit ($Q^2$) 26$q$, mode selection units 27$i$ and 27$q$, and gain setting units 28$i$ and 28$q$ so as to control the gain of the variable amplifiers 23$i$ and 23$q$ individually. The operation units 26$i$ and 26$q$ calculate square sums $\Sigma(I^2)$ and $\Sigma(Q^2)$ respectively, based on signals from the analog-to-digital converters 24$i$ and 24$q$, respectively. The mode selection units 27$i$ and 27$q$ each selects one of a plurality of operating modes characterized by difference updating periods, based on the results of operation in the operation units 26$i$ and 26$q$, respectively. The gain setting units 28$i$ and 28$q$ update the gain of the variable gain amplifiers 23$i$ and 23$q$, respectively, in the operating mode selected by the mode selection units 27$i$ and 27$q$, respectively.

With this construction, the operating mode for the I-component and that for the Q-component are set individually so that the gain of the variable gain amplifier 23$i$ and the gain of the variable gain amplifier 23$q$ are controlled independently.

The operation for selecting the operating mode of the gain setting units 28$i$ and 28$q$ is the same as the corresponding operation according to the first embodiment shown in FIGS. 2–6, so that the description thereof is omitted. Accordingly, the advantage available in the first embodiment is also available in the second embodiment. That is, the gain of the variable gain amplifier is updated in one of a plurality of operating modes characterized by different updating periods, in accordance with variation in the received power. Accordingly, the gain of the variable gain amplifier is adaptively controlled depending on the environment for communication.

Third Embodiment

Figure 8:
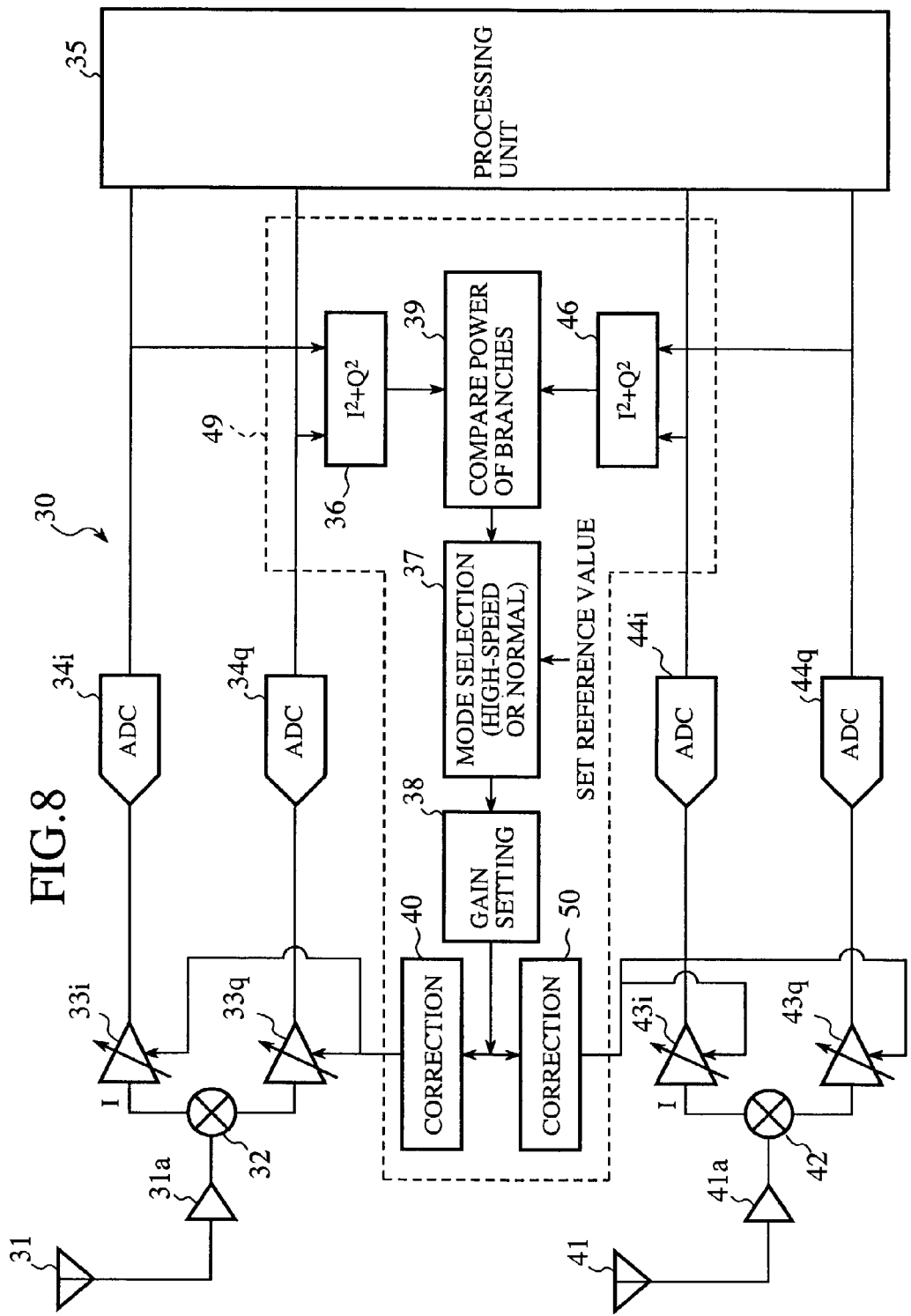
FIG. 8 is a block diagram showing an electrical construction of a wireless communication apparatus according to a third embodiment of the present invention.
Figure 9:
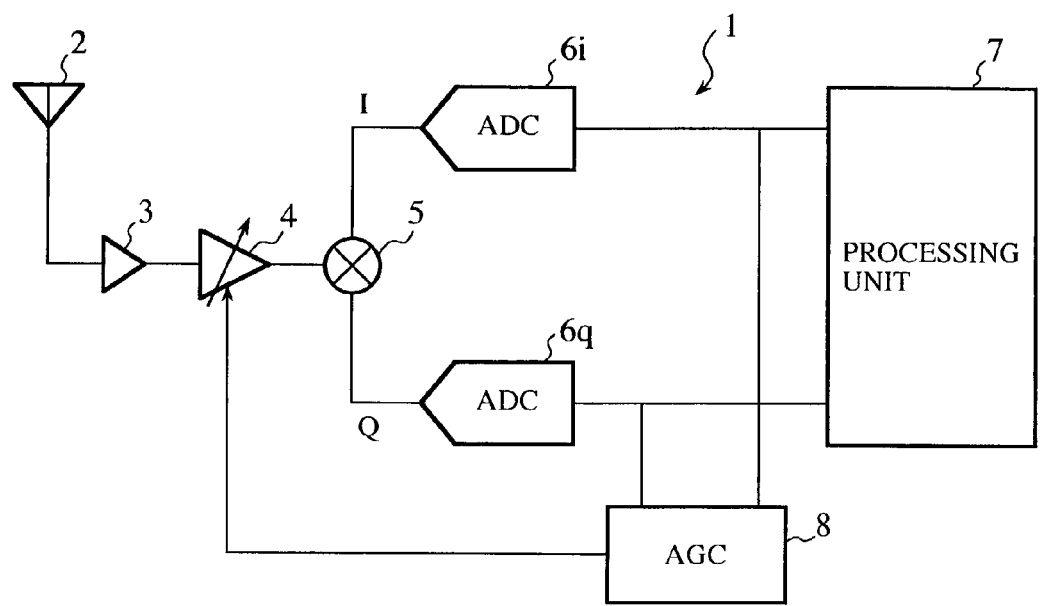
FIG. 9 shows a wireless communication apparatus according to the related art.

FIG. 8 is a block diagram showing an electrical construction of a wireless communication apparatus according to a third embodiment of the present invention. The wireless communication apparatus 30, a variation of the wireless communication apparatus of the first embodiment, comprises antennas 31 and 41, the amplifiers 31a and 41a, mixers 32 and 42, variable gain amplifiers (VGA) 33i, 33q, 43i, 43q, analog-to-digital converters 34i, 34q, 44i, 44q, a processing unit 35, and an automatic gain controller (AGC) 49.

The antennas 31, the amplifier 31a, the mixer 32, the variable gain amplifiers (VGA) 33i and 33q, and the analog-to-digital converters 34i and 34q constitute a first branch for diversity reception. These components are the same as the corresponding components of FIG. 1 so that the description thereof is omitted. The antenna 41, the amplifier 41a, the mixer 42, the variable gain amplifiers (VGA) 43i and 43q, and the analog-to-digital converters 44i and 44q constitute a second branch for diversity reception. These components are the same as the corresponding components of FIG. 1 so that the description thereof is omitted. The processing unit 35 is also the same as the corresponding unit of FIG. 1.

The automatic gain controller 49 is provided with an operation unit $(I^2+Q^2)$ 36, an operation unit $(I^2+Q^2)$ 46, a mode selection unit 37, a gain setting unit 38, and correction units 40 and 50, so as to control the gain of the variable gain amplifiers 33i, 33q, 43i and 43q. The operation unit 36 calculates $\Sigma(I^2+Q^2)$, based on signals from the analog-to-digital converters 34i and 34q. The operation unit 46 calculates $\Sigma(I^2+Q^2)$, based on signals from the analog-to-digital converters 44i and 44q.

A power comparison unit 39 compares power of the two branches. The mode selection unit 37 selects one of a plurality of operating modes characterized by different updating periods, based on a result of comparison by the power comparison unit 39. The gain setting unit 38 periodically updates the common gain of the variable gain amplifiers 33i, 33q, 43i and 43q in the operating mode selected by the mode selection unit 37. The correction units 40 and 50 each stores the level of gain control effective for an initial state in which an external radio signal is not received in the corresponding one of the branches. The level of gain control effected upon reception of the radio signal is corrected by the corresponding one of the correction units 40 and 50 and set in the variable gain amplifier in the corresponding one of the branches. More specifically, each of the correction units makes a correction to cancel difference in the level of gain control required due to irregularity in products constituting each of the branches so that the total gain of the branches match.

With this construction, the I component and the Q component are synthesized by the operation units 36 and 46, whereupon the signals from the first branch and the second branch are synthesized by the power comparison unit 39, so that the gain of the variable gain amplifiers 33i, 33q, 43i and 43q are centrally controlled by the gain setting unit 38. Accordingly, the construction of the apparatus is simplified. Since the operation units 36 and 46 perform a calculation $\Sigma(I^2+Q^2)$, the I component and the Q component are equally weighted. Therefore, proper performance in control is guaranteed under any environment for communication.

The operation of the gain setting unit 38 for selecting the operating mode is the same as the corresponding operation of the first embodiment shown in FIGS. 2–6, so that the description thereof is omitted. Accordingly, the advantage available in the first embodiment is also available in the third embodiment. That is, the common gain of the variable gain amplifiers is updated in one of a plurality of operating modes characterized by different updating periods, in accordance with variation in the received power. Accordingly, the gain of the variable gain amplifiers is adaptively controlled depending on the environment for communication and the precision in conversion by the analog-to-digital converters is maintained at a proper level.

In the third embodiment, the I component and the Q component are centrally controlled. Alternatively, the components may be controlled individually as in the second embodiment. In the third embodiment, the first branch and the second branch are described as being centrally controlled. Alternatively, the branches may be controlled individually.

INDUSTRIAL APPLICABILITY

The automatic gain controller and the wireless communication apparatus according to the present invention are suitably used in wireless base stations and wireless terminals of the CDMA system.

What is claimed is:

1. An automatic gain controller configured to control a gain of a variable gain amplifier provided at an input of an analog-to-digital converter, comprising:

a gain setting unit configured to periodically update the gain of the variable gain amplifier in accordance with an output from the analog-to-digital converter; and a mode selection unit configured to select for each frame a single operating mode of a plurality of operating modes characterized by different gain updating periods based on either a one-frame average value or a one-slot average value of the output from the analog-to-digital converter, the selected operating mode being set in said gain setting unit, wherein one frame includes a plurality of slots.

2. A wireless communication apparatus comprising:

an antenna configured to receive a radio signal;

a variable gain amplifier configured to amplify the received signal using a variable gain;

an analog-to-digital converter configured to convert the amplified signal into a digital signal;

a gain setting unit configured to periodically update the gain of the variable gain amplifier in accordance with an output from an analog-to-digital converter; and an operating mode selection unit configured to select for each frame a single operating mode of a plurality of operating modes characterized by different gain updating periods based on either a one-frame average value or a one-slot average value of the output from said analog-to-digital converter, the selected operating mode being set in said gain setting unit, wherein one frame includes a plurality of slots.

3. A wireless communication apparatus comprising:

an antenna configured to receive a radio signal;

an isolator configured to isolate an I-component and a Q-component orthogonal to each other from the received signal;

an I-component variable gain amplifier and a Q-component variable gain amplifier configured to amplify the isolated I-component and Q-component, respectively, using a variable gain;

an I-component analog-to-digital converter and a Q-component analog-to-digital converter configured to convert the amplified I-component and Q-component, respectively, into respective digital signals;

a gain setting unit configured to periodically update a gain common to said I-component variable gain amplifier and said Q-component variable gain amplifier, in accordance with outputs from said I-component analog-to-digital converter and said Q-component analog-to-digital converter; and an operating mode selection unit configured to select for each frame a single operating mode of a plurality of operating modes characterized by different gain updating periods based on either a one-frame average value or a one-slot average value of the outputs from said I-component analog-to-digital converter and said Q-component analog-to-digital converter, the selected operating mode being set in said gain setting unit, wherein one frame includes a plurality of slots.

4. A wireless communication apparatus comprising:

an antenna configured to receive a radio signal;

an isolator configured to isolate an I-component and a Q-component orthogonal to each other from the received signal;

an I-component variable gain amplifier and a Q-component variable gain amplifier configured to amplify the isolated I-component and Q-component using a variable gain;

an I-component analog-to-digital converter and a Q-component analog-to-digital converter configured to convert the amplified I-component and Q-component into respective digital signals;

an I-component gain setting unit configured to periodically update a gain of said I-component variable gain amplifier in accordance with an output from said I-component analog-to-digital converter;

an I-component operating mode selection unit configured to select for each frame a single operating mode of a plurality of operating modes characterized by different gain updating periods based on either a one-frame average value or a one-slot average value of the output from said I-component analog-to-digital converter, the selected operating mode being set in said I-component gain setting unit;

a Q-component gain setting unit configured to periodically update a gain of said Q-component variable gain amplifier in accordance with an output from said Q-component analog-to-digital converter; and a Q-component operating mode selection unit configured to select for each frame a single operating mode of a plurality of operating modes characterized by different gain updating periods based on either a one-frame average value or a one-slot average value of the output from said Q-component analog-to-digital converter, the selected operating mode being set in said Q-component gain setting unit, wherein one frame includes a plurality of slots.

5. A wireless communication apparatus comprising:

a first antenna and a second antenna configured to receive a radio signal;

a first variable gain amplifier and a second variable gain amplifier configured to amplify the signal received via said first antenna and second antenna, respectively;

a first analog-to-digital converter and a second analog-to-digital converter respectively configured to convert the amplified signals into respective digital signals;

a gain setting unit configured to periodically update a gain common to said first variable gain amplifier and second variable gain amplifier in accordance with an output from said first analog-to-digital converter and an output from said second analog-to-digital converter; and an operating mode selection unit configured to select for each frame a single operating mode of a plurality of operating modes characterized by different gain updating periods based on either a one-frame average value or a one-slot average value of the outputs from said first analog-to-digital converter and said second analog-to-digital converter, the selected operating mode being set in said gain setting unit, wherein one frame includes a plurality of slots.

6. The wireless communication apparatus according to claim 2, further comprising a processing unit configured to calculate a received power from the output value of the analog-to-digital converter using the gain set in the gain setting unit.

7. The wireless communication apparatus according to claim 3, further comprising a processing unit configured to calculate a received power from the output value of the analog-to-digital converter using the gain set in the gain setting unit.

8. The wireless communication apparatus according to claim 4, further comprising a processing unit configured to calculate a received power from the output value of the analog-to-digital converter using the gain set in the gain setting unit.

9. The wireless communication apparatus according to claim 5, further comprising a processing unit configured to calculate a received power from the output value of the analog-to-digital converter using the gain set in the gain setting unit.

10. The automatic gain controller according to claim 1, wherein the operating mode selection unit is configured to select between a high-speed mode and a normal mode, and the operating mode selection unit is configured to select the high-speed mode when the one-frame average value lies outside a first range and the one-slot average value lies outside a second range for each of a plurality of consecutive slots, the first range being a lesser included range of the second range.

11. A wireless communication apparatus according to claim 2, wherein the operating mode selection unit is configured to select between a high-speed mode and a normal mode, and the operating mode selection unit is configured to select the high-speed mode when the one-frame average value lies outside a first range and the one-slot average value lies outside a second range for each of a plurality of consecutive slots, the first range being a lesser included range of the second range.

12. The wireless communication apparatus according to claim 3, wherein the operating mode selection unit is configured to select between a high-speed mode and a normal mode, and the operating mode selection unit is configured to select the high-speed mode when the one-frame average value lies outside a first range and the one-slot average value lies outside a second range for each of a plurality of consecutive slots, the first range being a lesser included range of the second range.

13. The wireless communication apparatus according to claim 4, wherein each of the operating mode selection units is configured to select between a high-speed mode and a normal mode, and each of the operating mode selection units is configured to select the high-speed mode when the respective one-frame average value lies outside a first range and the respective one-slot average value lies outside a second range for each of a plurality of consecutive slots, the first range being a lesser included range of the second range.

14. The wireless communication apparatus according to claim 5, wherein the operating mode selection unit is configured to select between a high-speed mode and a normal mode, and the operating mode selection unit is configured to select the high-speed mode when the one-frame average value lies outside a first range and the one-slot average value lies outside a second range for each of a plurality of consecutive slots, the first range being a lesser included range of the second range.

15. A method of controlling a gain of a variable gain amplifier provided at an input of an analog-to-digital converter, comprising:

periodically updating the gain of the variable gain amplifier in accordance with an output from the analog-to-digital converter; and selecting for each frame a single operating mode of a plurality of operating modes characterized by different gain updating periods based on either a one-frame average value or a one-slot average value of the output from the analog-to-digital converter, the selected operating mode being set in said gain setting unit, wherein one frame includes a plurality of slots.

16. The automatic gain controller according to claim 15, wherein the step of selecting one of a plurality of operating modes includes:

selecting between a high-speed mode and a normal mode; and selecting the high-speed mode when the one-frame average value lies outside a first range and the one-slot average value lies outside a second range for each of a plurality of consecutive slots, the first range being a lesser included range of the second range.

17. An automatic gain controller configured to control a gain of a variable gain amplifier provided at an input of an analog-to-digital converter, comprising:

a gain setting unit configured to periodically update the gain of the variable gain amplifier in accordance with an output from the analog-to-digital converter; and means for selecting for each frame a single operating mode of a plurality of operating modes characterized by different gain updating periods based on either a one-frame average value and or a one-slot average value of the output from the analog-to-digital converter, the selected operating mode being set in said gain setting unit, wherein one frame includes a plurality of slots.

18. The automatic gain controller according to claim 17, wherein the means for selecting one of a plurality of operating modes includes:

means for selecting between a high-speed mode and a normal mode; and means for selecting the high-speed mode when the one-frame average value lies outside a first range and the one-slot average value lies outside a second range for each of a plurality of consecutive slots, the first range being a lesser included range of the second range.

* * * * *